(12) United States Patent
Shin et al.

(10) Patent No.: US 10,948,753 B2
(45) Date of Patent: Mar. 16, 2021

(54) FLEXIBLE SUBSTRATE AND FLEXIBLE DISPLAY DEVICE INCLUDING THE SAME

(71) Applicant: LG Display Co., Ltd., Seoul (KR)

(72) Inventors: Won-Jeong Shin, Paju-si (KR); Da-Young Kim, Paju-si (KR); Won-Gyu Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 139 days.

(21) Appl. No.: 16/209,011

(22) Filed: Dec. 4, 2018

(65) Prior Publication Data

US 2019/0171058 A1 Jun. 6, 2019

(30) Foreign Application Priority Data

Dec. 5, 2017 (KR) .................. 10-2017-0165799

(51) Int. Cl.
*G02F 1/1333* (2006.01)
*G02F 1/1368* (2006.01)
(Continued)

(52) U.S. Cl.
CPC ........ *G02F 1/133305* (2013.01); *G02F 1/136* (2013.01); *G02F 1/1368* (2013.01); *G02F 1/133308* (2013.01); *G02F 1/136286* (2013.01); *C09K 2323/00* (2020.08); *G02F 1/133314* (2021.01); *G09F 9/301* (2013.01);
(Continued)

(58) Field of Classification Search
CPC ............... G02F 1/133305; G02F 1/136; G02F 1/133308; G02F 1/1368; G02F 1/136286; G02F 1/133314; C09K 2323/00; Y02E 10/549; H01L 51/0097; H01L 51/524; H01L 27/3244; G09F 9/301
See application file for complete search history.

(56) References Cited

U.S. PATENT DOCUMENTS

2004/0225025 A1 11/2004 Sullivan et al.
2010/0309101 A1* 12/2010 Kanegae ............... H01L 51/529
345/76

(Continued)

FOREIGN PATENT DOCUMENTS

| CN | 1866323 A | 11/2006 |
|---|---|---|
| CN | 104813198 A | 7/2015 |
| CN | 109037460 A | 12/2018 |

OTHER PUBLICATIONS

Notification of the First Office Action dated Dec. 2, 2020, issued in corresponding Chinese Patent Application No. 2018114341387.

*Primary Examiner* — Anthony J Frost
(74) *Attorney, Agent, or Firm* — Morgan, Lewis & Bockius LLP (57) ABSTRACT

A flexible display device is disclosed. The disclosed flexible display device includes a flexible substrate; a thin film transistor on the flexible substrate; and a light emitting diode or a liquid crystal capacitor connected to the thin film transistor. The flexible substrate includes: a first base layer; a second base layer on a first surface of the first base layer; and a third base layer on a second surface of the first base layer. A surface hardness of the second base layer is greater than a surface hardness of the third base layer, and an adhesion strength of the third base layer is greater than an adhesion strength of the second base layer.

17 Claims, 5 Drawing Sheets

(51) Int. Cl.
    *G02F 1/1362*  (2006.01)
    *G02F 1/136*   (2006.01)
    *H01L 51/52*   (2006.01)
    *H01L 51/00*   (2006.01)
    *H01L 27/32*   (2006.01)
    *G09F 9/30*    (2006.01)

(52) U.S. Cl.
    CPC ...... *H01L 27/3244* (2013.01); *H01L 51/0097* (2013.01); *H01L 51/524* (2013.01); *Y02E 10/549* (2013.01)

(56) References Cited

U.S. PATENT DOCUMENTS

| | | | | |
|---|---|---|---|---|
| 2010/0317774 | A1* | 12/2010 | Sugioka | C08G 77/26 524/89 |
| 2011/0102885 | A1* | 5/2011 | Kim | C09J 7/38 359/359 |
| 2015/0301231 | A1 | 10/2015 | Yang et al. | |
| 2015/0353760 | A1* | 12/2015 | Bae | B05D 3/06 523/456 |
| 2016/0013443 | A1* | 1/2016 | Takemura | H01L 51/56 257/40 |

\* cited by examiner

FIG. 1

Related Art

FLEXIBLE SUBSTRATE AND FLEXIBLE DISPLAY DEVICE INCLUDING THE SAME

The present application claims priority from and the benefit of Korean Patent Application No. 10-2017-0165799 filed on Dec. 5, 2017, which is hereby incorporated by reference in its entirety for all purposes as if fully set forth herein.

BACKGROUND

Technical Field

The present disclosure relates to a display device, and more particularly, to a flexible substrate having light weight, thin thickness and high stiffness and a flexible display device including the same.

Discussion of the Related Art

With the rapid development of information technologies, display devices for displaying large amounts of information are being developed. Recently, flat panel display devices having a thin profile, light weight, and low power consumption, such as liquid crystal display devices or electroluminescent display devices, have been suggested and widely applied.

A type of flat panel display device is a liquid crystal display device, which includes a liquid crystal panel. The liquid crystal panel includes an upper substrate and a lower substrate attached to each other with a liquid crystal layer having liquid crystal molecules interposed therebetween as an essential component. Liquid crystal molecules of the liquid crystal layer are driven by an electric field generated between a pixel electrode and a common electrode. This process displays an image.

Another type of flat panel display device is an electroluminescent display device, which includes a light-emitting diode. The light-emitting diode includes an anode and a cathode opposite each other with a light-emitting layer interposed therebetween as an essential component. Holes and electrons respectively injected from the anode and the cathode are combined in the light-emitting layer to thereby emit light and display an image.

Recently, a demand for a flexible display device using a flexible substrate has increased. Because the flexible display device may be carried in a folded state and display an image in an unfolded state, it has the advantages of a large screen and easy portability.

Figure 1:
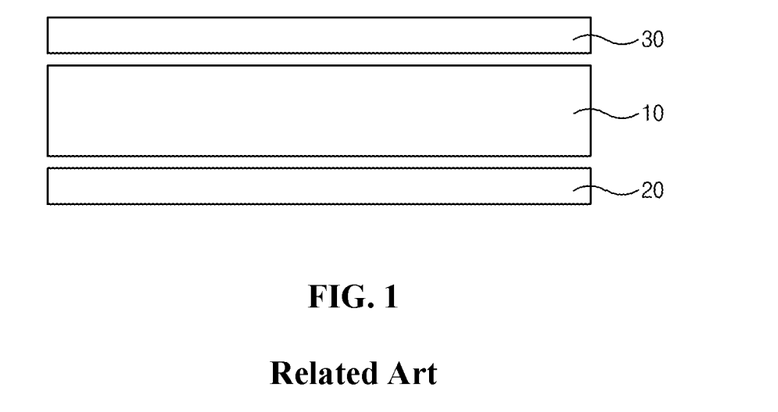
FIG. 1 is a cross-sectional view of a related art flexible display device.

FIG. 1 is a cross-sectional view of a related art flexible display device.

As illustrated in FIG. 1, the related art flexible display device includes a display panel 10, a back plate 20 under the display panel 10, and a cover window 30 over the display panel 10.

The display panel 10 may be obtained by attaching a carrier substrate (not shown in FIG. 1) to a rear surface of a flexible substrate (not shown in FIG. 1). This forms an element layer including a plurality of elements on a front surface of the flexible substrate and releases the carrier substrate from the flexible substrate. The cover window 30 is attached to an upper surface of the display panel 10 to protect the display panel 10 from external impacts. In addition, because the flexible substrate of the display panel 10 is very thin, the back plate 20 is attached to the rear surface of the flexible substrate to protect the flexible substrate from the external environment.

Generally, the back plate 20 is formed of polyethylene terephthalate. The back plate 20 has a thickness of 100 micrometers (μm) or more to prevent damages such as scratches. However, this increases a thickness of the flexible display device and lowers flexibility of the flexible display device. Further, the back plate 20 is attached to the flexible substrate of the display panel 10 through a lamination process, and the lamination process is not easy to apply to a large display device. Therefore, the related art flexible display device including the back plate 20 is limited when the area of the flexible display device is increased.

Additionally, because the flexible substrate and the back plate 20 are vulnerable to moisture permeation, the moisture can permeate and the elements formed on the flexible substrate can be degraded. Accordingly, to prevent or reduce the moisture from permeating the elements, a buffer layer can be formed on the flexible substrate. However, because the buffer layer has a multi-layer structure of inorganic layers, the manufacturing process and manufacturing time are increased.

Finally, the flexible substrate has relatively low adhesion to the carrier substrate. Therefore, detachment can occur between the flexible substrate and the carrier substrate during a process of manufacturing the display panel 10.

SUMMARY

Accordingly, example embodiments of the present disclosure are directed to a flexible substrate and a flexible display device that substantially obviate one or more of the problems due to limitations and disadvantages of the related art.

An aspect of the present disclosure is to provide a flexible display device with decreases thickness and improved flexibility. Another aspect of the present disclosure is to provide a flexible display device that has a relatively large area. Another aspect of the present disclosure is to provide a flexible display device that reduces the manufacturing process and manufacturing time. Another aspect of the present disclosure is to provide a flexible display device that improves adhesion between the flexible substrate and the carrier substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, and in accordance with the purpose of the present invention, as embodied and broadly described, a flexible substrate includes: a first base layer; a second base layer on a first surface of the first base layer; and a third base layer on a second surface of the first base layer, wherein a surface hardness of the second base layer is greater than a surface hardness of the third base layer, and an adhesion strength of the third base layer is greater than an adhesion strength of the second base layer.

In another aspect, a flexible display device includes: a flexible substrate; a thin film transistor on the flexible substrate; and a light emitting diode or a liquid crystal capacitor connected to the thin film transistor, wherein the flexible substrate includes: a first base layer; a second base layer on a first surface of the first base layer; and a third base layer on a second surface of the first base layer, wherein a surface hardness of the second base layer is greater than a surface hardness of the third base layer, and an adhesion strength of the third base layer is greater than an adhesion strength of the second base layer.

It is to be understood that both the foregoing general description and the following detailed description are by example and explanatory, and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this specification, illustrate example embodiments of the present disclosure and together with the description serve to explain various principles of the present disclosure. In the drawings.

DETAILED DESCRIPTION

Reference will now be made in detail to example embodiments of the present disclosure, examples of which may be illustrated in the accompanying drawings.

Figure 2:
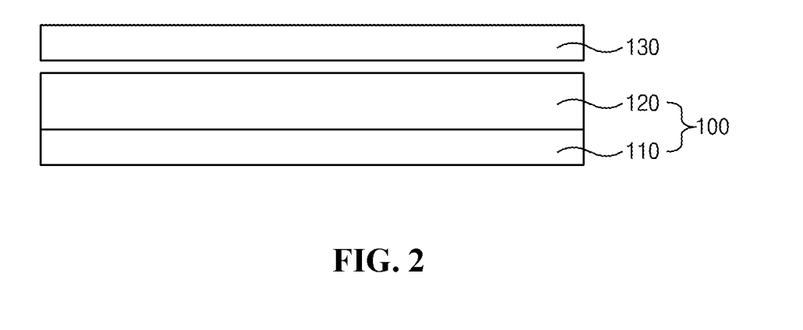
FIG. 2 is a cross-sectional view of a flexible display device according to an example embodiment of the present disclosure.

FIG. 2 is a cross-sectional view of a flexible display device according to an example embodiment of the present disclosure.

As illustrated in FIG. 2, the flexible display device according to an example embodiment of the present disclosure may include a display panel 100 and a cover window 130 over the display panel 100. The display panel 100 may include a flexible substrate 110 and an element layer 120 on the flexible substrate 110.

Figure 3A:
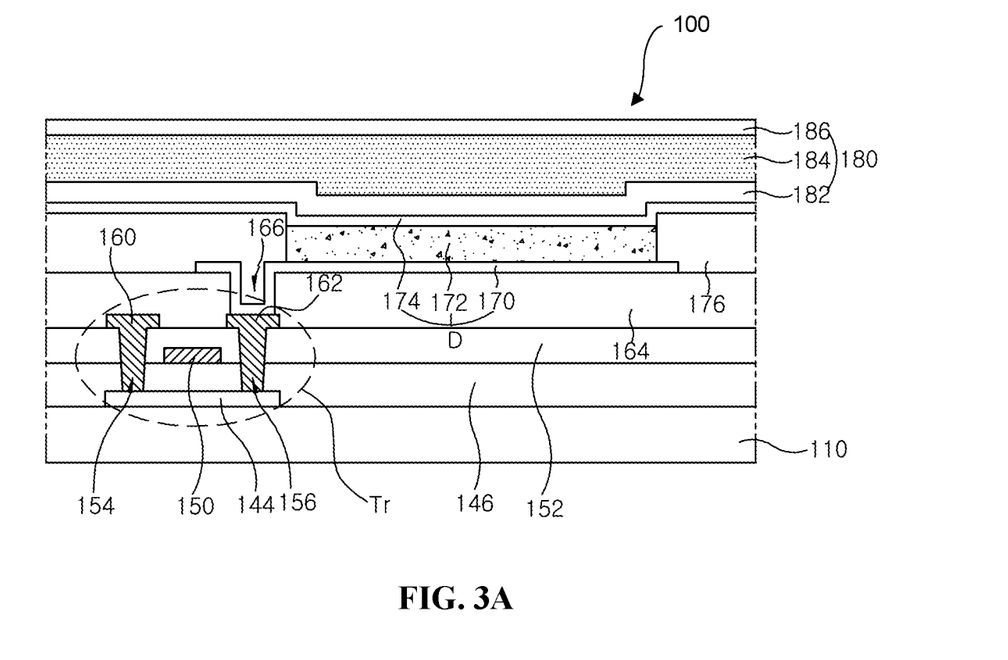
FIGS. 3A and 3B are cross-sectional views showing examples of a display panel for a flexible display device according to example embodiments of the present disclosure.
Figure 3B:
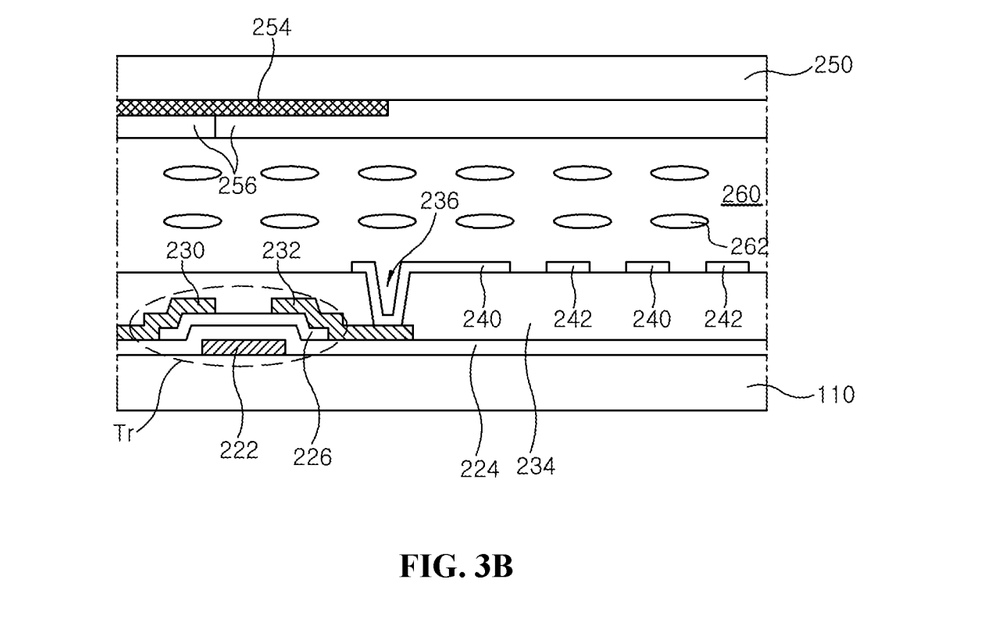

FIGS. 3A and 3B are cross-sectional views showing examples of a display panel for a flexible display device according to example embodiments of the present disclosure.

As illustrated in FIG. 3A, in an example embodiment, the display panel 100 may be an electroluminescent display panel. The display panel 100 may include a flexible substrate 110, a thin film transistor Tr disposed on the flexible substrate 110, a light emitting diode D connected to the thin film transistor Tr, and an encapsulation film 180 covering the light emitting diode D. The flexible substrate 110 may have relatively high surface hardness and/or adhesion strength. A lower surface of the flexible substrate 110 may have higher surface hardness than an upper surface of the flexible substrate 110, and the upper surface of the flexible substrate 110 may have higher adhesion strength than the lower surface of the flexible substrate 110. Such a flexible substrate 110 may have a multi-layer structure, which will be described in detail later.

A semiconductor layer 144 may be formed on the flexible substrate 110. In some example embodiments, the semiconductor layer 144 may be formed of an oxide semiconductor material and/or polycrystalline silicon. When the semiconductor layer 144 is formed of an oxide semiconductor material, a light-blocking pattern (not shown in FIG. 3A) may be formed under the semiconductor layer 144. The light-blocking pattern may block light from being incident on the semiconductor layer 144 to thereby prevent or reduce the semiconductor layer 144 from being degraded by the light. When the semiconductor layer 144 is formed of polycrystalline silicon, impurities may be doped in both side portions of the semiconductor layer 144.

A gate insulation layer 146 of an insulating material may be formed on the semiconductor layer 144. The gate insulation layer 146 may be formed of an inorganic insulating material, such as silicon oxide ($SiO_2$) and/or silicon nitride (SiNx).

A gate electrode 150 of a conductive material, such as metal, can be formed on the gate insulation layer 146 to correspond to a substantially central portion of the semiconductor layer 144.

As illustrated in FIG. 3A, the gate insulation layer 146 may be formed over substantially all of the flexible substrate 110. In some example embodiments, the gate insulation layer 146 may be patterned to have the same or a substantially similar shape as the gate electrode 150.

An interlayer insulation layer 152 of an insulating material may be formed on the gate electrode 150. The interlayer insulation layer 152 may be formed over substantially all of the flexible substrate 110. The interlayer insulation layer 152 may be formed of an inorganic insulating material such as silicon oxide ($SiO_2$) and/or silicon nitride (SiNx) and/or an organic insulating material such as benzocyclobutene, and/or photo acryl.

The interlayer insulation layer 152 may include first and second contact holes 154 and 156 that may expose top surfaces of both side portions of the semiconductor layer 144, respectively. The first and second contact holes 154 and 156 may be spaced apart from the gate electrode 150, and the gate electrode 150 may be disposed between the first and second contact holes 154 and 156. The first and second contact holes 154 and 156 may also be formed in the gate insulation layer 146. In some example embodiments, when the gate insulation layer 146 is patterned to have the same or a substantially similar shape as the gate electrode 150, the first and second contact holes 154 and 156 may be formed only in the interlayer insulation layer 152.

A source electrode 160 and a drain electrode 162 of a conductive material such as metal may be formed on the interlayer insulation layer 152. The source and drain electrodes 160 and 162 may be spaced apart from each other with respect to the gate electrode 150. The source and drain electrodes 160 and 162 may contact both side portions of the semiconductor layer 144 through the first and second contact holes 154 and 156, respectively.

The semiconductor layer 144, the gate electrode 150, the source electrode 160, and the drain electrode 162 may constitute the thin film transistor Tr. The thin film transistor Tr may function as a driving element. In some example embodiments, the thin film transistor Tr may have a coplanar structure where the gate electrode 150 and the source and drain electrodes 160 and 162 are disposed over the semiconductor layer 144. In other example embodiments, the thin film transistor Tr may have an inverted staggered structure where the gate electrode is disposed under the semiconductor layer and the source and drain electrodes are disposed over the semiconductor layer. In this instance, the semiconductor layer may be formed of amorphous silicon.

Although not shown in FIG. 3A, a gate line and a data line cross each other to define a pixel region, and a switching element connected to the gate line and the data line may be formed. The switching element may also be connected to the thin film transistor Tr of the driving element. The switching element may have the same structure as the thin film transistor Tr. In addition, a power line may be further formed in parallel to and spaced apart from the gate line or the data line, and a storage capacitor may be further formed to constantly maintain a voltage at the gate electrode of the thin film transistor Tr during one frame.

A passivation layer 164 may be formed to cover the thin film transistor Tr and may have a drain contact hole 166 exposing the drain electrode 162. A first electrode 170 may be formed on the passivation layer 164 and may be connected to the drain electrode 162 of the thin film transistor Tr through the drain contact hole 166. The first electrode 170 may be separately disposed in each pixel region. The first electrode 170 may be an anode and may be formed of a conductive material having a relatively high work function. For example, the first electrode 170 may be formed of a transparent conductive material, such as indium tin oxide (ITO) and/or indium zinc oxide (IZO).

In some example embodiments, the display panel 100 of the present disclosure may be a top emission type electroluminescent display panel where light emitted from a light emitting layer is outputted to the outside through a second electrode opposite to the first electrode 170. A reflection electrode or reflection layer may be further formed under the first electrode 170. For example, the reflection electrode or reflection layer may be formed of aluminum-palladium-copper (APC) alloy.

A bank layer 176 may be formed on the first electrode 170 and the passivation layer 164. The bank layer 176 may cover edges of the first electrode 170. The bank layer 176 may expose a substantially central portion of the first electrode 170 corresponding to the pixel region.

A light emitting layer 172 may be formed on the first electrode 170 exposed by the bank layer 176. In some example embodiments, the light emitting layer 172 may have a single-layer structure of a light emitting material layer. In other example embodiments, to increase luminous efficiency, the light emitting layer 172 may have a multi-layer structure and may include a hole injection layer, a hole transporting layer, a light emitting material layer, an electron transporting layer, and/or an electron injecting layer sequentially laminated on the first electrode 170. A light emitting material of the light emitting material layer may be an organic light emitting material or an inorganic light emitting material such as quantum dots.

A second electrode 174 may be formed over the flexible substrate 110 on which the light emitting layer 172 is formed. The second electrode 174 may be formed over substantially all of a display area. The second electrode 174 may be formed of a conductive material having relatively low work function and may serve as a cathode. For example, the second electrode 174 may be formed of aluminum (Al), magnesium (Mg), and/or their alloys, but the second electrode 174 is not limited thereto.

The first electrode 170, the light emitting layer 172 and the second electrode 174 may constitute the light emitting diode D.

The encapsulation film 180 is formed on the second electrode 174 to prevent moisture of the outside from permeating the light emitting diode D. The encapsulation film 180 may include a first inorganic insulation layer 182, an organic insulation layer 184, and a second inorganic insulation layer 186, but the encapsulation film 180 is not limited thereto.

In some embodiments, when the display panel 100 of the present disclosure is a top emission type electroluminescent display panel, a polarizer (not shown in FIG. 3A) may be attached to the encapsulation film 180 to reduce reflection of external light. For example, the polarizer may be a circular polarizer.

As illustrated in FIG. 3B, in an example embodiment, the display panel 100 of the present disclosure may be a liquid crystal display panel. The display panel 100 may include first and second flexible substrates 110 and 250 facing each other. The display panel 100 may further include, as the element layer 120 (FIG. 2) between the first and second flexible substrates 110 and 250, a thin film transistor Tr and a liquid crystal capacitor connected to the thin film transistor Tr.

In an example embodiment, at least one of the first and second flexible substrates 110 and 250 may have a relatively high surface hardness and adhesion strength. A lower surface of the flexible substrate 110 may have higher surface hardness than an upper surface of the flexible substrate 110, and an upper surface of the flexible substrate 110 may have higher adhesion strength than the lower surface of the flexible substrate 110. Such a flexible substrate 110 may have a multi-layer structure, which will be described in detail later.

A thin film transistor Tr may be formed on an inner surface of the first flexible substrate 110. That is, a gate electrode 222 may be formed on the first flexible substrate 110, and a gate insulation layer 224 may be formed to cover the gate electrode 222. Also, a gate line (not shown in FIG. 3B) connected to the gate electrode 222 may be formed on the first flexible substrate 110.

A semiconductor layer 226 may be formed on the gate insulation layer 224 to correspond to the gate electrode 222. In some example embodiments, the semiconductor layer 226 may be formed of an oxide semiconductor material. In other example embodiments, the semiconductor layer 226 may include an active layer of intrinsic amorphous silicon and/or ohmic contact layers of impurity-doped amorphous silicon.

Source and drain electrodes 230 and 232 may be formed on the semiconductor layer 226 and may be spaced apart from each other. In addition, a data line (not shown in FIG. 3B) connected to the source electrode 230 may be formed on the gate insulation layer 224 and may cross the gate line to thereby define a pixel region.

The gate electrode 222, the semiconductor layer 226, the source electrode 230, and the drain electrode 232 may constitute a thin film transistor Tr. A passivation layer 234 may be formed on the thin film transistor Tr. The passivation layer 234 has a drain contact hole 236 exposing the drain electrode 232.

A pixel electrode 240 and a common electrode 242 may be formed on the passivation layer 234. Parts of the pixel electrode 240 and parts of the common electrode 242 may alternate each other. The pixel electrode 240 may be connected to the drain electrode 232 through the drain contact hole 236.

A black matrix 254 may be formed on an inner surface of the second flexible substrate 250. The black matrix 254 may shield a non-display area such as the thin film transistor Tr, the gate line, and/or the data line. A color filter layer 256 may be formed on the second flexible substrate 250 to correspond to the pixel region, in which case, the black matrix 254 may be omitted.

The first and second flexible substrates 210 and 250 may be attached to each other with the liquid crystal layer 260 interposed therebetween. The liquid crystal molecules 262 of the liquid crystal layer 260 may be driven by an electric field generated between the pixel electrode 240 and the common electrode 242. The pixel electrode 240, the common electrode 242, and the liquid crystal layer 260 may constitute a liquid crystal capacitor, and the liquid crystal capacitor may be connected to the thin film transistor Tr.

Although not shown in FIG. 3B, an alignment layer can be formed on each of the first and second flexible substrates 110 and 250 adjacent to the liquid crystal layer 260. Further, first and second polarizers having light transmission axes perpendicular to each other may be attached on outer surfaces of the first and second flexible substrates 110 and 250, respectively. A flexible type backlight unit may be disposed under the first flexible substrate 110 to provide light.

In some example embodiments, the common electrode 242 may be formed on the first flexible substrate 110 and may include parts alternating with parts of the pixel electrode 240. In other example embodiments, the common electrode may be formed on an entire or substantially entire surface of the second flexible substrate 250, and the pixel electrode may be formed on the first flexible substrate 110 to have a plate shape corresponding to the pixel region.

With reference to FIG. 2, the cover window 130 may be disposed over the display panel 100. For example, the cover window 130 may be formed of transparent plastic and may be attached to the display panel 100 through an adhesive layer (not shown in FIG. 2).

The flexible substrate 110 of the present disclosure may have relatively high surface hardness and/or adhesion strength. The lower surface of the flexible substrate 110 may have higher surface hardness than the upper surface of the flexible substrate 110, and the upper surface of the flexible substrate 110 may have higher adhesion strength than the lower surface of the flexible substrate 110. Accordingly, the flexible display device according to an example embodiment of the present disclosure may not include a back plate. The lower surface of the flexible substrate 110 may have a surface hardness of 3H or more, and the upper surface of the flexible substrate 110 may have an adhesion strength of 0.7 N/cm or more.

The flexible substrate 110 of the present disclosure may have a relatively low water vapor transmission rate (WVTR). Accordingly, the flexible display device according to an example embodiment of the present disclosure may not include a buffer layer between the flexible substrate 110 and the element layer 120.

Figure 4:
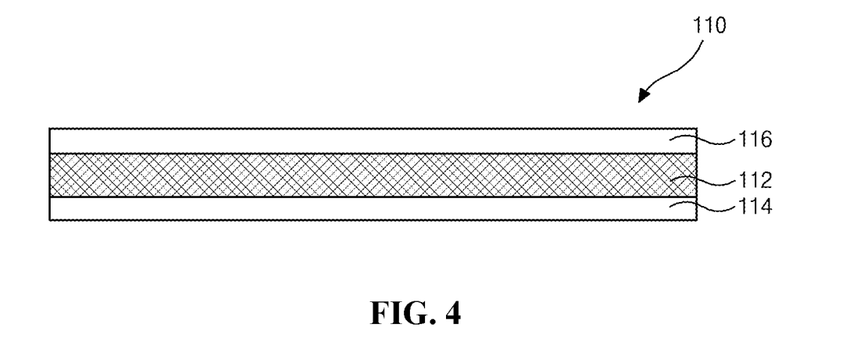
FIG. 4 is a cross-sectional view of a flexible substrate according to an example embodiment of the present disclosure.

FIG. 4 is a cross-sectional view of a flexible substrate according to an example embodiment of the present disclosure.

As illustrated in FIG. 4, the flexible substrate 110 according to an example embodiment of the present disclosure may include a first base layer 112, a second base layer 114 on a first surface of the first base layer 112 (e.g., a lower surface of the first base layer 112), and a third base layer 116 on a second surface of the first base layer 112 (e.g., an upper surface of the first base layer 112).

The first base layer 112 may be formed of a plastic having relatively high thermal stability. For example, the first base layer 112 may be formed of polyimide, but is not limited thereto.

The second and third base layers 114 and 116 may each include a silane compound and/or a siloxane compound. Contents of the silane compound and the siloxane compound in the second and third base layers 114 and 116 may be different from each other.

In the second base layer 114, the content of the siloxane compound may be greater than the content of the silane compound. In the third base layer 116, the content of the siloxane compound may be less than or equal to the content of the silane compound. In the third base layer 116, the content of the silane compound may be greater than or equal to the content of the siloxane compound. Therefore, the content of the siloxane compound of the second base layer 114 may be greater than the content of the siloxane compound of the third base layer 116, and the content of the silane compound of the third base layer 116 may be greater than the content of the silane compound of the second base layer 114.

The second base layer 114 may include the siloxane compound of 70 to 90 wt % and the silane compound of 10 to 30 wt %. The third base layer 116 may include the siloxane compound of 10 to 50 wt % and the silane compound of 50 to 90 wt %. In some example embodiments, the siloxane compound may be polysiloxane represented by formula (1).

(1)

In formula (1), R may be hydrogen, methyl group or ethyl group, and n may be equal to 1 to 30, but formula (1) is not limited thereto.

The silane compound may be methoxysilane represented by formula (2), iso-butysilane represented by formula (3), aminosilane represented by formula (4), or n-octylsilane represented by formula (5).

(2)

(3)

(4)

(5)

In formulas (2)-(5), R may be hydrogen, methyl group or ethyl group, but formulas (2)-(5) are not limited thereto.

In the flexible substrate 110 according to an example embodiment of the present disclosure, the second base layer 114 may have higher surface hardness than the third base layer 116, and the third base layer 116 may have higher adhesion strength than the second base layer 114.

The surface hardness of the second base layer 114 may be equal to or higher than 3H, which may be higher than the surface hardness of the back plate 20 in FIG. 1 of the related art, which is 2H or less. Therefore, in the flexible display device of the present disclosure, the thickness may be decreased and the flexibility may be increased by omitting the back plate. Accordingly, the scratch resistance property may be improved. In some example embodiments, the flexible substrate 110 may have a thickness of 15 to 50 μm, but is not limited thereto.

In some example embodiments, the adhesion strength of the third base layer 116 may be 0.7 N/cm or more, and preferably, 0.74 N/cm to 2.0 N/cm. In this example, third base layer 116 may be an inorganic layer and may be an amorphous silicon layer. Because the silane compound may serve as an organic and inorganic coupling agent, the third base layer 116 may improve interfacial adhesion to the inorganic layer formed on the flexible substrate 110 such that the element layer 120 of FIG. 2 may be formed.

In some example embodiments, the adhesion strength of the second base layer 114 may be greater than 0.07 N/cm, and preferably, 0.08 N/cm to 0.45 N/cm. Even more preferably, the adhesion strength of the second base layer 114 may be 0.3 N/cm to 0.4 N/cm.

In other example embodiments, a flexible substrate formed of polyimide not including any additive may have an adhesion strength of 0.05 N/cm to 0.07 N/cm. In this example, a flexible substrate may be formed of polyimide including an adhesion promoter as an additive for improving adhesion, where the adhesion promoter may have an adhesion strength of 0.15 N/cm to 0.2 N/cm. Accordingly, the flexible substrate 110 of the present disclosure may be prevented from peeling off from a carrier substrate without adding any additive during the manufacturing process of the display panel 100.

The flexible substrate 110 including the second and third base layers 114 and 116 may have a relatively low WVTR, and may have a relatively large contact angle with respect to liquid. In some example embodiments, the WVTR of the flexible substrate 110 may be about $10^{-4}$ g/m²/day, which is lower than the WVTR of the related art back plate 20 of FIG. 1, which may be about $10^{1}$ g/m²/day. Also, the WVTR of the flexible substrate 110 may be lower than the WVTR of the related art flexible substrate including a buffer layer, which may be about $10^{-3}$ g/m²/day. Accordingly, the process may be simplified by omitting the buffer layer, and the moisture barrier property may be improved as compared with the buffer layer.

In some example embodiments, the contact angle of the flexible substrate 110 of the present disclosure, which may be about 100 degrees to 110 degrees, may be larger than the contact angle of the related art flexible substrate without a buffer layer, which is about 50 degrees to 53 degrees. Also, the contact angle of the flexible substrate 110 of the present disclosure may be larger than the contact angle of the related art flexible substrate including the buffer layer, which is about 25 degrees to 30 degrees. Therefore, the flexible substrate 110 of the present disclosure may reduce contamination due to moisture or foreign substances as compared with the related art flexible substrates, thus improving stain resistance.

FIGS. 5A to 5E are cross-sectional views showing a flexible display device at steps in a method of fabricating the flexible display device according to an example embodiment of the present disclosure.

Figure 5A:
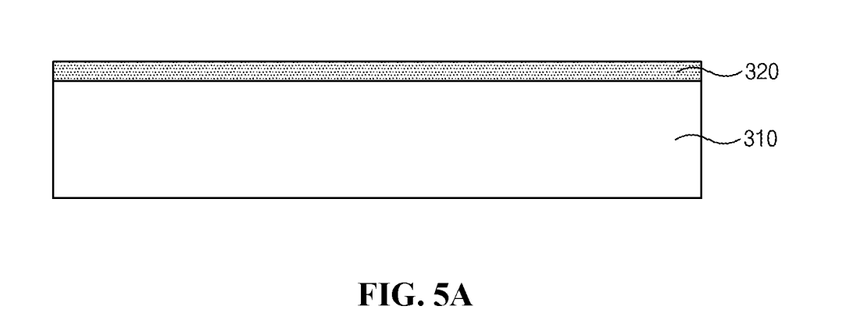
FIGS. 5A to 5E are cross-sectional views showing a flexible display device at steps in a method of fabricating the flexible display device according to an example embodiment of the present disclosure.

As illustrated in FIG. 5A, a sacrificial layer 320 may be formed on a carrier substrate 310. The sacrificial layer 320, which may be an inorganic layer, may be formed through a deposition process. In some example embodiments, the sacrificial layer 320 may be formed of amorphous silicon and the carrier substrate 310 may be formed of glass, but are not limited thereto.

Figure 5B:
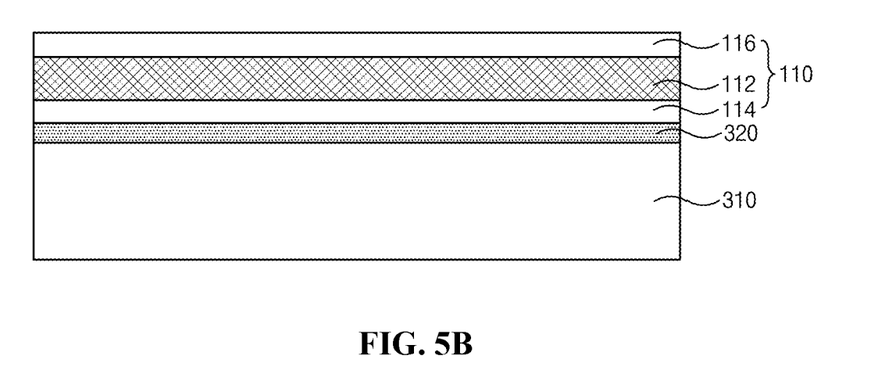

As illustrated in FIG. 5B, a flexible substrate 110 including first, second and third base layers 112, 114 and 116 may be formed on the sacrificial layer 320. A resin including a siloxane compound and a silane compound may be applied to the sacrificial layer 320 and may be cured, thereby forming the second base layer 114. The content of the siloxane compound may be greater than the content of the silane compound. A polyimide resin may be applied to the second base layer 114 and may be cured, thereby forming the first base layer 112. A resin including a siloxane compound and/or a silane compound may be applied to the first base layer 112 and may be cured, thereby forming the third base layer 116. The content of the silane compound may be greater than or equal to the content of the siloxane compound.

Figure 5C:
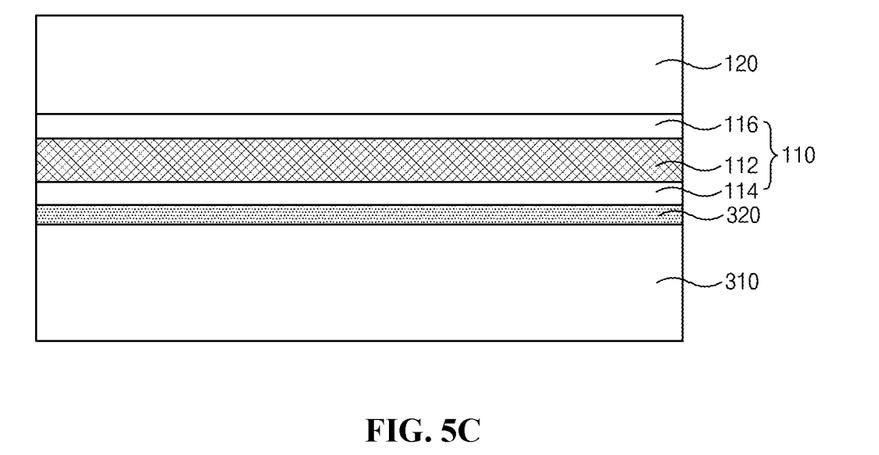

Then, as illustrated in FIG. 5C, an element layer 120 may be formed on the third base layer 116 of the flexible substrate 110. The element layer 120 may include a thin film transistor and a light emitting diode or a liquid crystal capacitor connected to the thin film transistor. The adhesion strength of the second base layer 114 to an inorganic layer may be about 0.08 N/cm to 0.45 N/cm. Therefore, the flexible substrate 110 may be prevented from peeling off from the sacrificial layer 320 in a process of forming the element layer 120. In addition, the adhesion strength of the third base layer 116 to an inorganic layer may be about 0.74 N/cm to 2.0 N/cm. Thus, it is possible to form the element layer 120 on the third base layer 116.

Figure 5D:
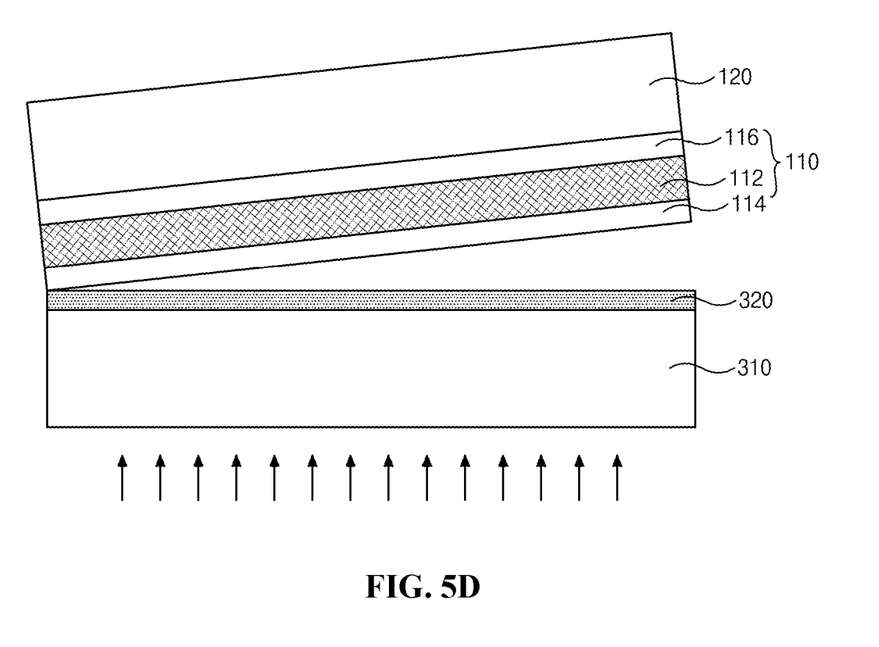

Next, as illustrated in FIG. 5D, a laser may be irradiated to the sacrificial layer 320 at a rear surface of the carrier substrate 310, and crystallinity of the sacrificial layer 320 may be changed. Therefore, the flexible substrate 110 on which the element layer 120 is formed may become detached from the sacrificial layer 320 on the carrier substrate 310.

Figure 5E:
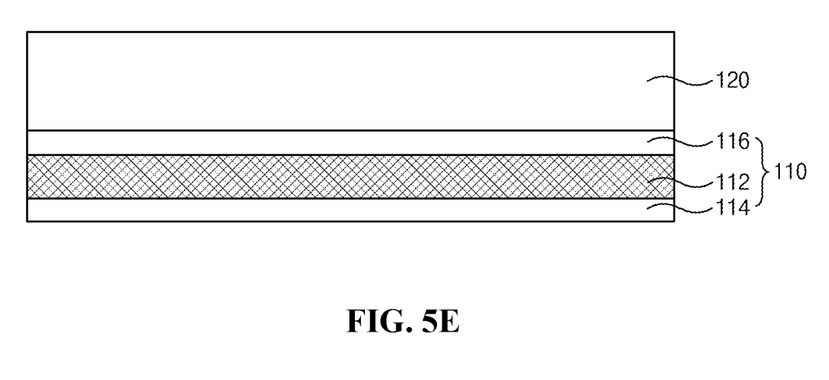

Then, as illustrated in FIG. 5E, a display panel including the flexible substrate 110 and the element layer 120 may be fabricated. A cover window 130 (FIG. 2) may be attached to an upper surface of the element layer 120, thereby completing the flexible display device.

In the flexible display device including the flexible substrate 110 according to example embodiments of the present disclosure, the back plate may be omitted so that the thickness of the flexible display device may be decreased and the flexibility may be prevented from being lowered. In addition, because a lamination process is not required, the limitation on the area may be solved, and the flexible display device may have a relatively large area. Further, the buffer layer may be omitted so that the manufacturing process may be simplified. Finally, the detachment between the flexible substrate 110 and the carrier substrate may be prevented during the manufacturing process because the adhesion to the sacrificial layer 320 may be improved without an additive.

It will be apparent to those skilled in the art that various modifications and variations can be made in the flexible substrate and flexible display device of the present disclosure without departing from the technical idea or scope of the disclosure. Thus, it is intended that the present disclosure cover the modifications and variations of this disclosure, provided that they come within the scope of the appended claims and their equivalents.

What is claimed is:

1. A flexible substrate, comprising:
   a first base layer;
   a second base layer on a first surface of the first base layer; and
   a third base layer on a second surface of the first base layer,
   wherein a surface hardness of the second base layer is greater than a surface hardness of the third base layer, and an adhesion strength of the third base layer is greater than an adhesion strength of the second base layer,
   wherein each of the second and third base layers comprises a silane compound and a siloxane compound,
   wherein the siloxane compound comprises a compound represented by the formula:

where R is hydrogen, methyl group or ethyl group, and n is an integer from 2 to 30, inclusive, and
   wherein the silane compound comprises a compound represented by one of the formulas:

where R is hydrogen, methyl group or ethyl group.

2. The flexible substrate of claim 1, wherein each of the second and third base layers comprises different contents of the silane compound and the siloxane compound.

3. The flexible substrate of claim 2, wherein weight percentage of the siloxane compound in the second base layer is greater than weight percentage of the siloxane compound in the third base layer, and weight percentage of the silane compound in the second base layer is less than weight percentage of the silane compound in the third base layer.

4. The flexible substrate of claim 2, wherein the content of the siloxane compound in the second base layer is greater than the content of the silane compound in the second base layer, and the content of the siloxane compound in the third base layer is less than or equal to the content of the silane compound in the third base layer.

5. The flexible substrate of claim 1, wherein the first base layer is formed of polyimide.

6. A flexible display device, comprising:
   a flexible substrate;
   a thin film transistor on the flexible substrate; and
   a light emitting diode or a liquid crystal capacitor connected to the thin film transistor,
   wherein the flexible substrate includes:
     a first base layer;
     a second base layer on a first surface of the first base layer; and
     a third base layer on a second surface of the first base layer,
     wherein a surface hardness of the second base layer is greater than a surface hardness of the third base layer, and an adhesion strength of the third base layer is greater than an adhesion strength of the second base layer, and
     wherein the first base layer and third base layer are disposed between the second base layer and the thin film transistor and the third base layer is disposed between the first base layer and the thin film transistor.

7. The flexible display device of claim 6, wherein each of the second and third base layers comprises a silane compound and a siloxane compound.

8. The flexible display device of claim 7, wherein each of the second and third base layers comprises different contents of the silane compound and the siloxane compound.

9. The flexible display device of claim 8, wherein weight percentage of the siloxane compound in the second base layer is greater than weight percentage of the siloxane compound in the third base layer, and weight percentage of the silane compound in the second base layer is less than weight percentage of the silane compound in the third base layer.

10. The flexible display device of claim 8, wherein the content of the siloxane compound in the second base layer is greater than the content of the silane compound in the second base layer, and the content of the siloxane compound in the third base layer is less than or equal to the content of the silane compound in the third base layer.

11. The flexible display device of claim 7, wherein the siloxane compound comprises a compound represented by the formula:

where R is hydrogen, methyl group or ethyl group, and n is an integer from 2 to 30, inclusive.

12. The flexible display device of claim 11, wherein the silane compound comprises a compound represented by one of the formulas:

where R is hydrogen, methyl group or ethyl group.

13. The flexible display device of claim 6, wherein the first base layer is formed of polyimide.

14. The flexible display device of claim 6, wherein the first base layer is disposed between the second base layer and the third base layer.

15. The flexible substrate of claim 1, wherein the first base layer is disposed between the second base layer and the third base layer.

16. The flexible substrate of claim 2, wherein the second base layer includes the siloxane compound of 70 to 90 wt % and the silane compound of 10 to 30 wt %, and the third base layer includes the siloxane compound of 10 to 50 wt % and the silane compound of 50 to 90 wt %.

17. The flexible display device of claim 6, wherein the thin film transistor comprises a semiconductor layer, a gate electrode, a source electrode, and a drain electrode, and
wherein at least one of the semiconductor layer and the gate electrode directly contacts the third base layer.

* * * * *